(12) United States Patent
Fan et al.

(10) Patent No.: US 6,274,917 B1
(45) Date of Patent: Aug. 14, 2001

(54) HIGH EFFICIENCY COLOR FILTER PROCESS FOR SEMICONDUCTOR ARRAY IMAGING DEVICES

(75) Inventors: Yang-Tung Fan, Shin-chu; Sheng-Liang Pan, Hsin-Chu; Bii-Cheng Chang, Hsin-Chu; Kuo-Liang Lu, Hsin Chu, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/693,505

(22) Filed: Oct. 23, 2000

Related U.S. Application Data

(62) Division of application No. 09/414,925, filed on Oct. 12, 1999, now Pat. No. 6,171,885.

(51) Int. Cl.[7] .................... H01L 31/0232; H01L 27/148; H01L 29/768
(52) U.S. Cl. .......................... 257/432; 257/232; 257/233; 257/435
(58) Field of Search .................................. 257/232, 233, 257/432, 435, 437

(56) References Cited

U.S. PATENT DOCUMENTS

| | | | |
|---|---|---|---|
| 5,595,930 | 1/1997 | Back ........................................ | 437/53 |
| 5,672,519 | 9/1997 | Song et al. ................................. | 437/3 |
| 5,693,967 | * 12/1997 | Parks et al. ............................ | 257/223 |
| 5,796,154 | 8/1998 | Sano et al. ............................. | 257/432 |
| 6,171,883 | * 1/2001 | Fan et al. .............................. | 438/65 |

* cited by examiner

Primary Examiner—Ngân V. Ngô
(74) Attorney, Agent, or Firm—George O. Saile; Stephen B. Ackerman

(57) ABSTRACT

A microelectronic method is described for optimizing the fabrication of optical and semiconductor array structures for high efficiency color image formation in solid-state cameras. Disclosed is an ordered fabrication sequence in which microlens formation precedes color filter layer formation to enable increased image light collection efficiency, to encapsulate and protect the microlens elements from chemical and thermal processing damage, to minimize topographical underlayer variations which would axially misalign or otherwise aberrate microlens elements formed on non-planar surfaces, and, to complete the most difficult steps early in the process to minimize rework and scrap. A CMOS, CID, or CCD optoelectronic configuration is formed by photolithographically patterning a planar-array of photodiodes on a Silicon or other III-V, II-VI, or compound semiconductor substrate. The photodiode array is provided with metal photoshields, passivated, planarized, and, a first convex microlens array of high curvature or other suitable lenses are formed thereon. A transparent encapsulant is deposited to planarize the microlens layer and provide a spacer for the successive deposition(s) of one or more color filter layers. The microlens array may be formed from positive photoresists and the spacer from negative resist, with close attention to matching the index of refraction at layer interfaces. A final surface layer comprising a color filter completes the solid-state color image-forming device.

9 Claims, 5 Drawing Sheets

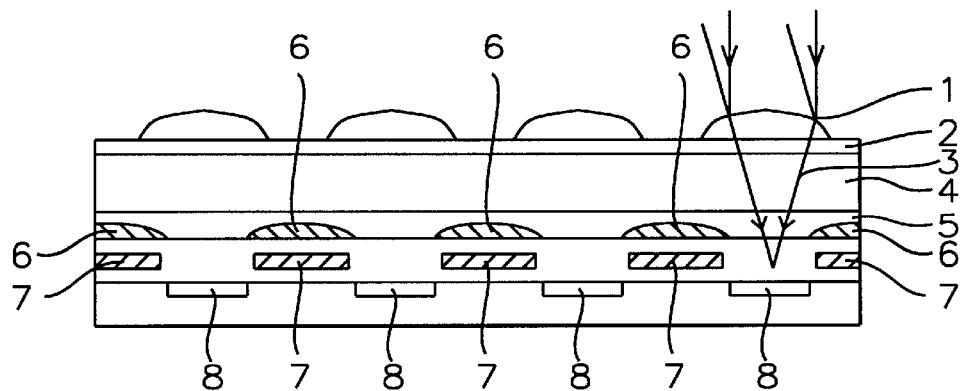
FIG. 1 - Prior Art
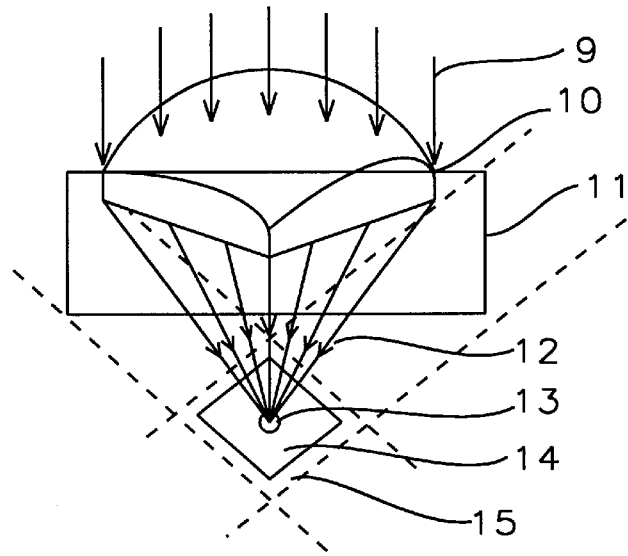
FIG. 2 - Prior Art
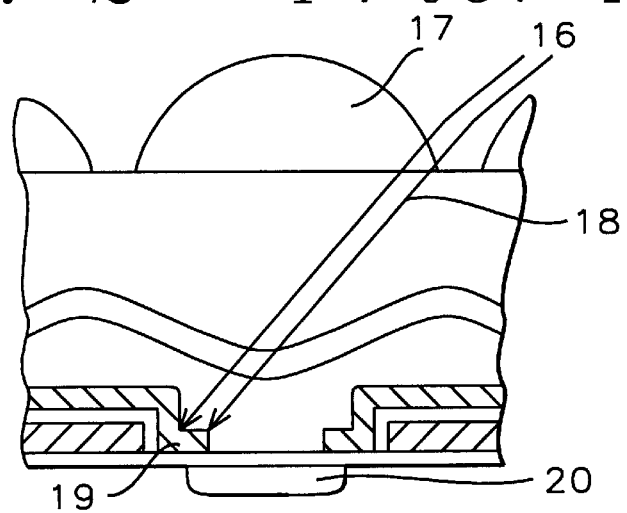
FIG. 3 - Prior Art

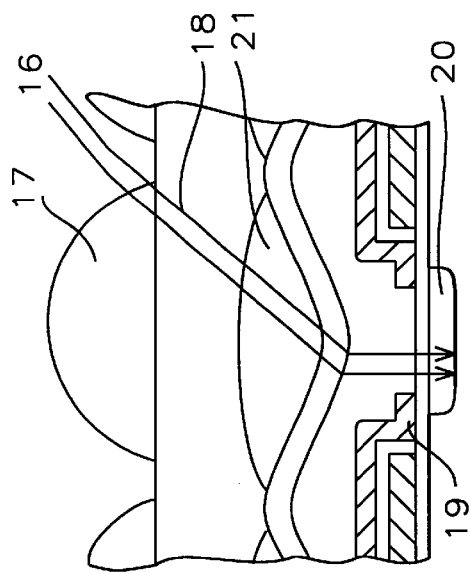
FIG. 4 – Prior Art
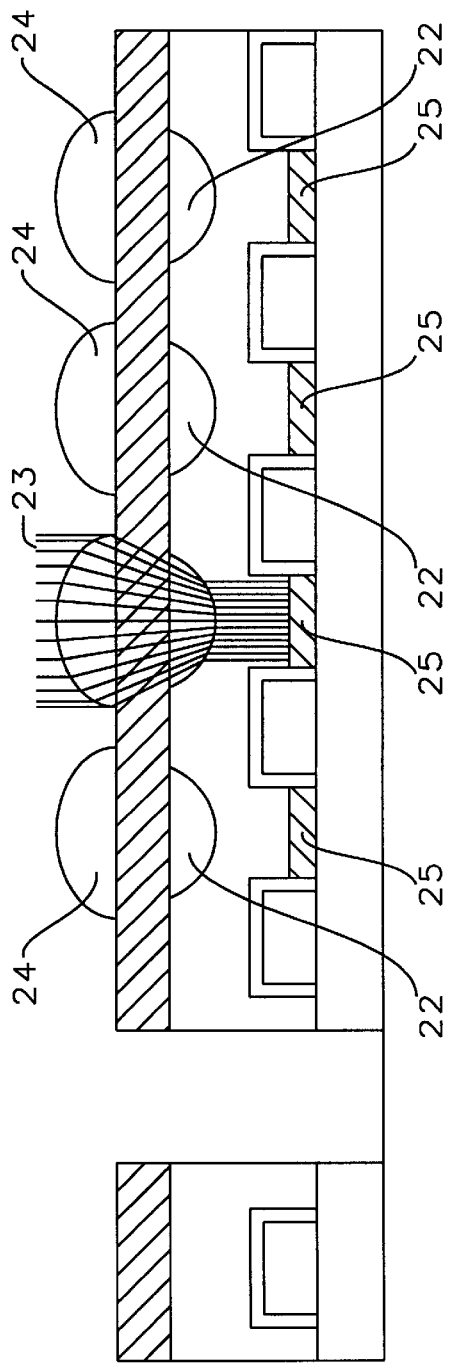
FIG. 5 – Prior Art

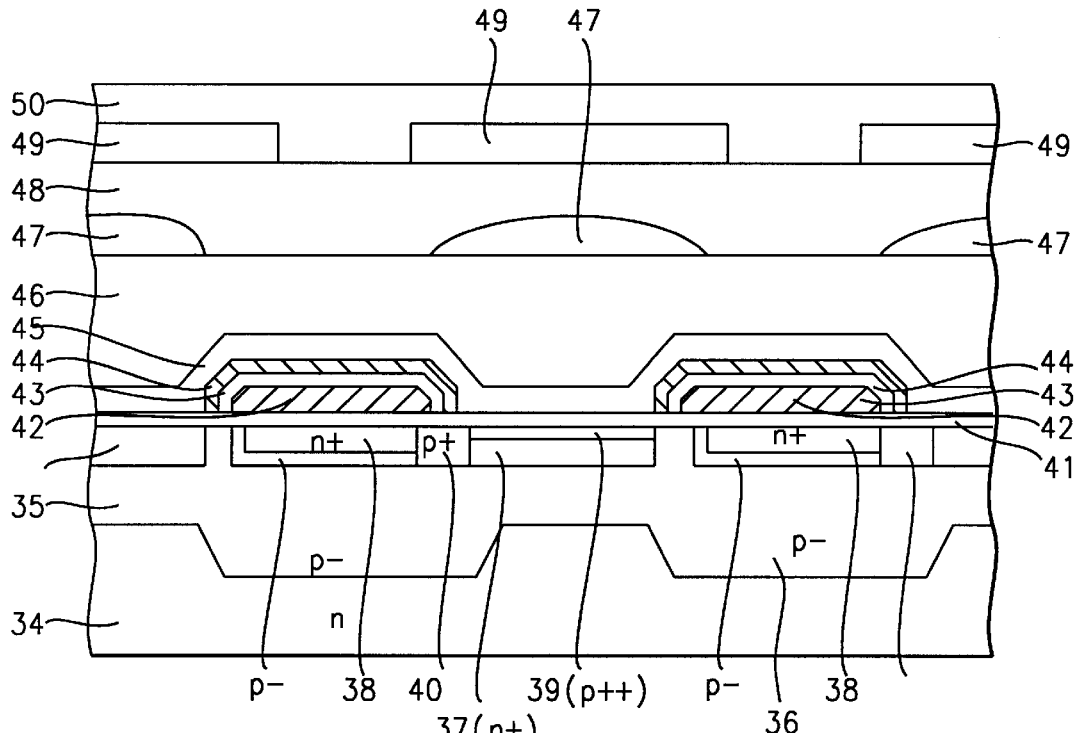
FIG. 8
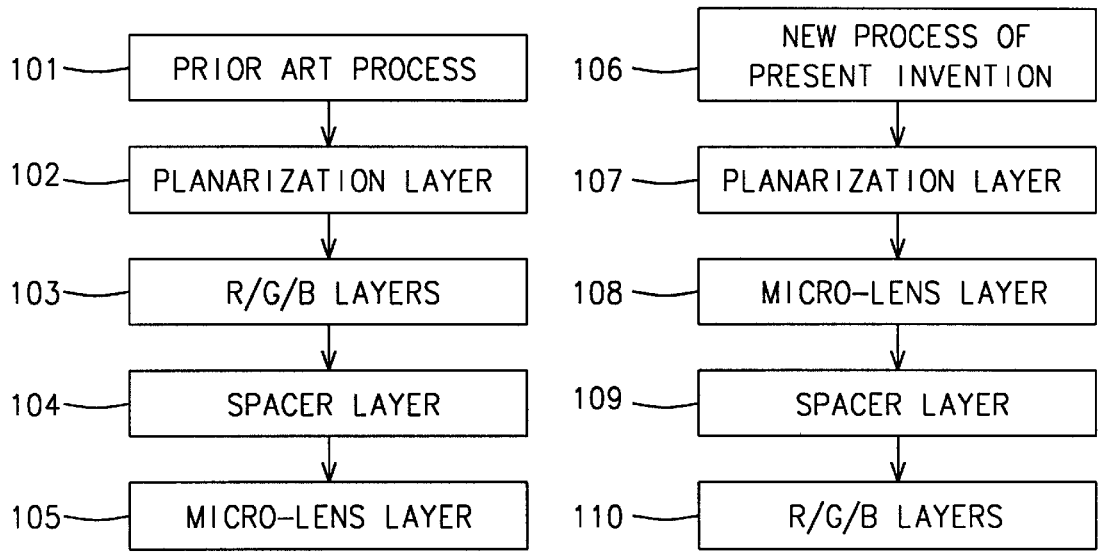
FIG. 9A
FIG. 9B

HIGH EFFICIENCY COLOR FILTER PROCESS FOR SEMICONDUCTOR ARRAY IMAGING DEVICES

This is a division of patent application Ser. No. 09/414,925, filing date Oct. 12, 1999, now U.S. Pat. No. 6,171,885 High Efficiency Color Filter Process For Semiconductor Array Imaging Devices, assigned to the same assignee as the present invention.

BACKGROUND OF THE INVENTION (1) Field of the Invention

The present invention relates to a highly efficient microelectronic process for the formation of optical structures used in the fabrication of color filters and microlens arrays for optoelectronic semiconductor imaging devices which optimize light collection and pixel spectral signal contrast.

(2) Description of Prior Art

Conventional solid-state image sensors for color analog or digital video cameras are typically charge-coupled device (CCD) or complementary metaloxide semiconductor (CMOS) photocdiode array structures which comprise a spectrally photosensitive layer below one or more layers patterned in an array of color filters and above which resides a surface-layer array of microlens elements.

The elementary unit of the imager is defined as a pixel. Each pixel is characterized as an addressable area element with intensity and chroma attributes related to the spectral signal contrast derived from the photon collection efficiency of the microlens array, the spectral transmissivity or reflectivity properties of the color filters, lens array and planarization materials, the spectral response, external quantum efficiency, intrinsic electrical noise properties of the photodetectors and electronic signal processing train. Light and color-sensitive integrated circuits require carefully configured color filters to be deposited on the upper layers of a device in order to accurately translate a visual image into its color components. Conventional configurations may generate a color pixel by employing four adjacent pixels on an image sensor. Each of the four pixels is covered by a different color filter selected from the group of red, blue and two green pixels, thereby exposing each monochromatic pixel to only one of the three basic colors. Simple algorithms are subsequently applied to merge the inputs from the three monochromatic pixels to form one full color pixel. The color filter deposition process and its relationship to the microlens array formation process determine the production cycle-time, test-time, yield, and ultimate manufacturing cost. It is an object of the present invention to teach a color-filter process which optimizes these stated factors.

In addition to the dynamic range and noise of the individual photodetectors, the resolution or fidelity of a CCD or CMOS image is influenced by the overall array size, individual pixel size, spacing, and fill factor. Quantitatively, this performance is described by a wavelength-dependent modulation transfer function (MTF) that relates the two-dimensional Fourier transform of the input image to that of the output. In addition to the obvious effects of pixel aperture and shape, the MTF of an array is affected by spatial carrier diffusion, temporal diffusion, and optical diffraction.

While color image formation may be accomplished by recording appropriately filtered images using three separate arrays, such systems tend to be large and costly. Cameras in which a full color image is generated by a single detector array offer significant improvements in size and cost but have inferior spatial resolution. Single-chip color arrays typically use color filters that are aligned with individual columns of photodetector elements to generate a color video signal. In a typical stripe configuration, green filters arc used on e(very other column with the intermediate columns alternatively selected for red or blue recording. To generate a color video signal using an array of this type, intensity information from the green columns is interpolated to produce green data at the red and blue locations. This information is then used to calculate a red-minus-green signal from red-filtered columns and a blue-minus-green signal from the blue ones. Complete red-minus-green and blue-minus-green images are subsequently interpolated from this data yielding three complete images. Commercial camcorders uses a process similar to this to generate a color image but typically utilize more-complicated mosaic-filter designs. The use of alternate columns to yield color information decreases the spatial resolution in the final image.

The ability of a sensor to capture images in low-level irradiance conditions is critical in applications. The primary attributes of the sensor that determine its ability to capture low-level image light are the geometrical optics of the lens arrangement, fill-factors of lenses and photodiodes, and the photoclectron quantum efficiency and spectral response of the semiconductor in which the photodicdes are fabricated. The quantum efficiency is a measure of the photon-to-electron conversion ratio and, for most CCDs these quantum efficiencies are similar. But, the physical size of the photosensitive area or pixel, coupled with the geometry of the lenses for collecting light and imaging this light onto the useful photosensitive area, create superior or inferior solid-state imagers. Larger pixels use more silicon area which drives up the solid-state imager device manufacturing cost. Instead of increasing the active area, imager manufacturers add extra steps to the manufacturing process to apply a microlens and color filter over each pixel. FIG. 1 exhibits the conventional Prior Art vertical semiconductor cross-sectional profile and optical configuration for color image formation. Microlens 1 residing on a planarization layer which serves as a spacer 2 collects a bundle of light rays from the image presented to the video camera and converges the light into focal cone 3 onto photodiode 8 after passing through color filter 4 residing on planarization layer 5, passivation layer 6, and metallization layer 7. The purpose of the microlens' application in CCD and CMOS imaging devices is to increase imaging sensing efficiency. FIG. 2 illustrates the geometrical optics for incident image light 9 converged by microlens element 10, color filter 11, into focal cone 12, to the focal area 13 within a photoactive area 14 surrounded by a dead or non-photosensitive area 15, wherein the sum of the areas of 14 and 15 comprise the region of the pixel.

Sano et al in U.S. Pat. No. 5,796,154 teaches a solid-state imaging device with a vertical dual-lens structure arranged to redirect the oblique, high-angle off-axis light rays of the image from points occluded by patterned photoshields back onto filling the open apertures of the photodiodes. Sano et al cite their preferred embodiment as a configuration in which the color filter layer(s) is positioned between the upper and lower microlens elements comprising the vertical compound lens. FIG. 3 illustrates the Prior Art in which obliquely incident light 16 is imaged by a single convex microlens 17 and is refractively deviated 18 to miss the open aperture of the photodiode element 20, instead impinging on the pholoshield part 19. In FIG. 4 the Prior Art is shown with a first (lower) convex microlens 21 below the second (upper) microlens 16 to compensate for the high incidence angle of the light rays, placing the image back onto the active area 20 of the sensor.

The problem addressed and claimed to be solved by the referenced patent of Sano et al is that of improving light collection by forming a compound vertical lens with an intermediate color filter between the lens-plane layers.

It is clear, therefore, that lens formation on the topmost layer will suffer from topography and conformability problems imposed by the layers deposited earlier in the microelectronic fabrication process.

An alternative Prior Art approach to the solution of improving image light collection onto the active area of a mosaic array CCD or CMOS image device is provided by Baek in U.S. Pat. No. 5,595,930. As shown in FIG. 5, Baek discloses a method of manufacturing a CCD image sensor wherein recesses 22 are formed in the microelectronic fabrication process, filled with a dye layer, and serve as an array of concave microlenses to collimate the bundle of incident light rays 23 passed by an upper microlens 24 onto the active area of the photodiode imaging array 25.

While the fabrication sequence is different from that of Sano et al, Baek's referenced patent shares the similarity of a vertical compound dual-lens arrangement with an intermediate color filter layer comprised of the dye-filled second concave lens.

It is recognized that both the Baek and Sano referenced patents suffer similar problems of fabricating top-layer microlens arrays over underlayer topographies which are becoming more difficult as pixel sizes shrink.

SUMMARY OF THE INVENTION

A principal object of the present invention is to teach a highly efficient microelectronic fabrication process for color filter and microlens formation, and, particularly to depart from Prior Art by teaching the sequence for the formation of the microlens layer or layers to be before color filter layer formation. In accord with a principal object of the present invention, there is provided by the present invention a manufacturable method and fabrication process sequence which minimizes the number and task-times of the operational steps required in the production of semiconductor array color imagers.

A further object of the present invention is to provide a fabrication method to provide multi-microlens array structures, arrangements, configurations, and combinations with spectral color filters that maximize collection-efficiency of optical radiation patterns of images superimposed on the surface of semiconductor array imaging devices.

A still further object of the present invention is to provide a fabrication method for microlens and color filter formation for high reproducibility, reliability, and, consequently maximum yield and minimum total run time and production cost.

Another object of the present invention is to encapsulate and protect the microlens from damage by chemical material and/or thermal oxidation in high temperature microelectronic processing environments by changing from the conventional outside (top-layer) position to an inside (embedded) protected position.

It is also recognized that the present invention and its manufacturing process permit the formation of vertical compound microlens arrangements, including conventional vertical dual-lens pairs, with all the attendant advantages of being first in the process sequence before color filter layer formation. Since microlens layer formation is among the most difficult fabrication steps, early completion enables minimum rework, scrap costs, and process run time, while maximizing final test yields.

Capture cone angle is consistent with higher microlens efficiency and relief in the design.

It is a further object of the present invention to position a high numerical aperture microlens in closer proximity to the active area of the photosensor to achieve wider capture acceptance cone angles for peak light collection efficiency. This increase in capture cone angle is consistent with higher microlens efficiency and relief in the design windows for future smaller pixel sizes associated with increasing imager array resolution and reducing materials cost.

Another object of the present invention is to obviate topographical variation and roughness problems encountered with the conventional prior art formation sequences wherein microlens structures are processed after color filter layer and planarization layer steps. In the present invention, the precedence flow-chart of the fabrication sequence creates the microlens plane-array before the build-up of conformality variations associated with multiple deposition steps. It is well known in the art of optical lens design that uncontrolled variations in lens curvature, lens thickness, and optical-axis position or orientation will result in aberrations and image distortion. In video cameras, optical aberrations and image distortions may also result in motional smear, graininess, resolution degradation, and undesirable color imaging effects.

In accord with the objects of this invention, the fabrication sequence taught enables unrestricted classes, shapes, optical design or imaging properties of single or multi microlens optical constructs which can be combined with either conventional or novel color filters or their formation process, including interference or multi-dielectric stacks, dyes, or other materials or color filter types. A fortiori, it is recognized by the optical constructs and manufacturing method of the present invention, that because the microlens arrays are formed prior to the color filters, that overlay patterns of the individual color filter elements make possible spectral corrections or enhancements in the microlens design, allowing spectrally matching two-dimensional lattices or stripe patterns of microlens elements to achieve a closer approximation to diffraction-limited imaging resolution. Single chip color arrays typically use color filters that are aligned with individual columns of photodetector elements to generate a color video signal. In a typical stripe configuration, green filters are used on every other column with the intermediate columns alternately selected for red or blue recording. Various combinations and permutations of color filter sequences or color filter "masks" are possible, and, a number of microprocessor algorithms exist for balancing color components in the synthetic reconstruction of the color images.

To practice the method of the present invention, conventional microelectronic fabrication techniques using photolithographic materials, masks and etch tools are employed: in succession the array of in-junction photodiodes is patterned with impurity dopants diffused or ion-implanted, electrically isolated, and planarized over. A first pattern of precursor microlens structures, comprised of single or multiple co-planar lens elements, is formed, etched, and thermally reflowed. The microlens array is subsequently planarized by a successive deposition step, and, if desired, a second pattern of precursor microlens structures, again comprised of single or multiple co-planar lens elements, is exposed, developed, and anisotropically etched to form a vertical aligned compound lens with the microlens elements of the first plane-array. As many planarizations and microlens-array planes as desired may successively be formed by repetition of the previously described fabrication sequence. Following the completion of the microlens plane-array formation above the photodetector array, typically three more layers are built up additively with primary red, green blue color filters formed by the addition of suitable dyes appropriate to the desired spectral transmissivitiy to be associated with specified photodetector coordinate addresses in the imager matrix.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the Accompanying drawings, which form a material part of this disclosure, wherein:

FIG. 1 is a schematic cross-sectional profile of semiconductor and optical structures showing a typical order of elements of a conventional Prior Art device for color image formation.

FIG. 2 shows a simple single microlens image formation process and the basic light collection problem in color pixel image formation.

FIG. 3 illustrates a sample ray-trace for the geometrical optics problem of light-loss associated with single-microlens imaging.

FIG. 4 demonstrates the vertical compound dual-lens arrangement with an intermediate color filter practiced in Prior Art.

FIG. 5 shows an alternative Prior Art optical element sequence wherein the first microlens formed is concave and may contain a first dye layer to integrate the first color filter.

FIG. 8 is a schematic cross-sectional profile of the present invention showing the first microlens layer above the photoactive regions of the semiconductor array imaging device, and, a higher-lying color filter layer .

FIGS. 9A and 9B illustrate the distinction between a conventional Prior Art fabrication sequence and the new process sequence of the present invention.

DESCRIPTION OF THE PREFERRED EMBODIMENTS

The present invention discloses that there exists a unique fabrication sequence in which the order of forming the microlens layer(s) prior to the color filter layer(s) in the semiconductor imaging device structure will maximize reliability, optical collection efficiency, spectral transmittance, microlens axial alignment to the substrate, and minimize manufacturing total run-time, final yield and production cost.

Figure 6:
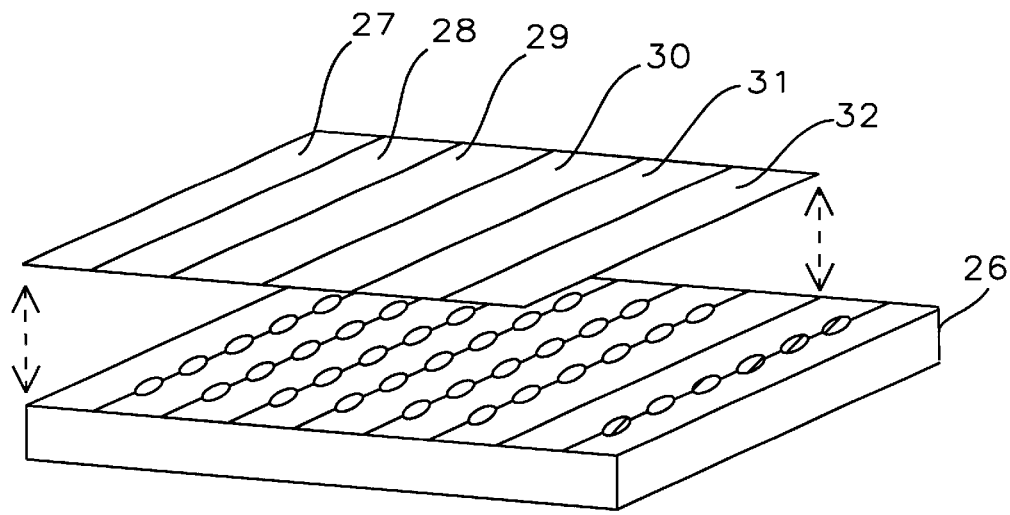
FIG. 6 depicts the orderly arrangement of a color filter "mask" overlaying a matrix of photodetector rows and columns in the synthetic reconstruction of color images.
Figure 7:
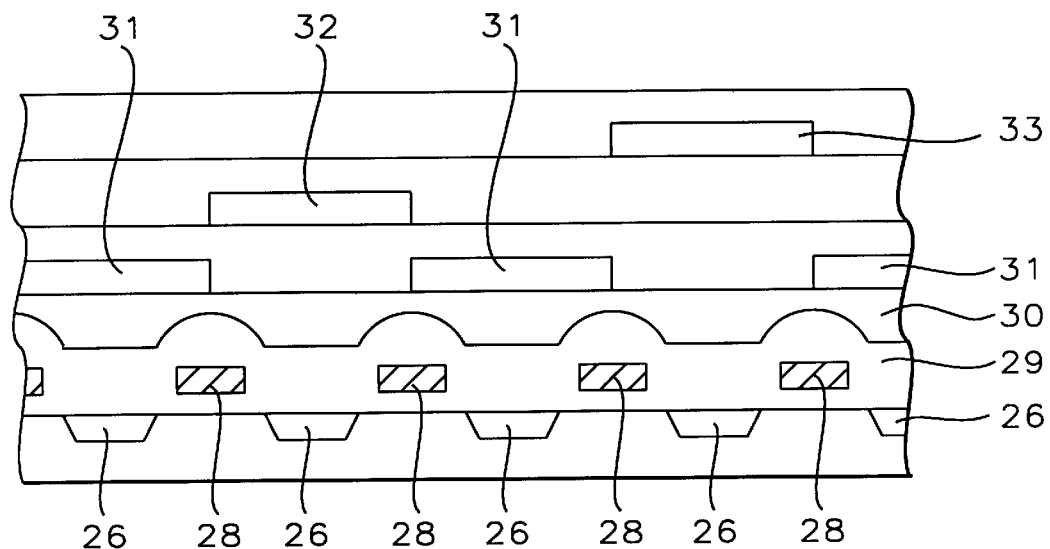
FIG. 7 shows the vertical organization of a color filter layer structure corresponding to the semiconductor processing sequence required to construct a color filter mask similar to the configuration shown in FIG. 6.

FIG. 6 exhibits a representative example for the generation of a color image by a single photodetector array 26 by using a color filter mask comprised of green stripe, red stripe, green stripe 29, blue stripe 30, green stripe 31, and red stripe 32. In this scheme, green filters are placed over alternate photodetector columns. Red and blue filters alternate in the spaces between them. Interpolation routines are used to generate three-color data for all pixel positions. FIG. 7 provides a schematic cross-sectional view for a three-dimensional version of the scheme shown in FIG. 6. In both FIG. 6 and FIG. 7, the microlens arrays are intentionally left out to simplify the discussion of the filter fabrication sequence and configuration for color pixel synthetic reconstruction. In FIG. 7, photoactive regions 26 on semiconductor substrate 27, are successively overlayed with a patterned conductor layer 28, blanket passivation layer 29, blanket planarizing layer 30, first color filter layer 31 for green, second color filter layer 32 for red, and third color filter layer 33 for blue. Reading from left to right in FIG. 7, one observes the order of green, red, green, blue, and, repeating sequences.

FIG. 8 depicts the cross-sectional view of the preferred embodiment of the present invention showing in particular the priority formation of the microlens array in proximity to the photoactive regions of the solid-state array imager. FIG. 8 illustrates the case of a CCD imager fabrication sequence , but it is clearly recognized that the present invention equally well applies to charge-injection device (CID) imagers and CMOS imagers. In FIG. 8. an "n" (negative) type semiconductor substrate 34, is photolithographically patterned by suitable photoresist coating, masking, exposing and developing, to open regions for ion-implant or diffusion doping by selected impurity atoms to form p– (weakly doped positive) type wells 35 and 36. With similar photolithography steps, ion-implants or diffusions, an n+ type region 37 is formed to create a pn-junction photodiode and a vertical charge coupled device 38. A highly doped positive impurity, p++, is introduced selectively to form a surface isolation layer 39, and a p-type well 40 is formed to isolate the CCD device 38. To isolate pixels, a p+ channel stop 40 is formed. The gate insulator 41 is then applied over the surface of the substrate. The vertical profile is completed by processing successive additions of transmission gate 42, interlevel insulator 43, light-shielding layer 44, passivation layer 45, planarization layer 46, and in accord with the preferred embodiment of the present invention, first microlens array-plane layer 47, transparent planarization and spacer layer 48, color filter layer 49, and encapsulant and planarization layer 50. The option of further cascading and overlaying of additional filter layers is recognized by the present invention.

The preceding fabrication sequence is illustrated by, but not limited to, the example given. In the case of desiring an optical design with compound vertical lens structures, additional microlens layers are readily introduced at the position of the next layer in tandem with the planarization and encapsulant layer 48 of FIG. 8, or by introducing additional filter or spacer layers therein.

FIG. 9 depicts the simplified comparative fabrication flow-charts of the new process of the present invention which distinguish it from the sequence of the Prior Art process. In accord with the flow chart shown in FIG. 9, the manufacturing method of the present invention teaches priority formation of a high numerical aperture, high curvature microlens in close proximity to the sensor elements of the matrix array comprising the semiconductor imager.

The present invention further recognizes that the formation of a microlens array from positive photoresist renders the microlens susceptible to damage from chemical and thermal treatments inherent in microelectronic processing when formed at a surface, such process being conventionally practiced in the Prior Art.

The present invention similarly recognizes the existence of the benefit of employing negative photoresist material for the spacer, having high transmittance and lower refractive index preferrably less than or equal to 1.4, to more closely match that of air which is normalized to unity. That is, the more closely matched interfaces are in index of refraction, the less light is reflected, scattered, or "lost" at layer boundaries.

Figure 10:
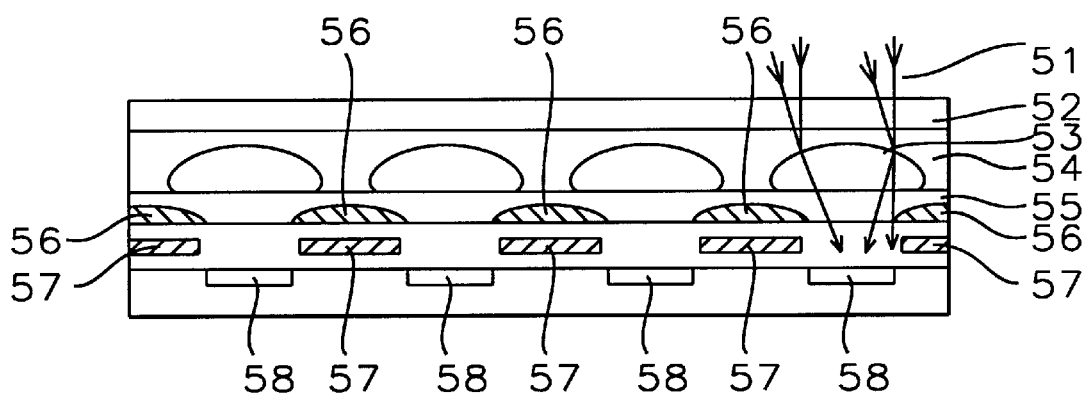
FIG. 10 shows a simplified cross-sectional representation of the order of the optical and semiconductor structures described in the simplified flow chart of FIG. 9.

FIG. 10 is a cross-sectional view showing the resultant solid-state imaging device order of structures when fabricated by the manufacturing flow-chart sequence prescribed in FIG. 9. The preferred embodiment defined in FIG. 10 exhibits the color pixel image formation process. Ray traces are shown for both collimated and oblique incident light 51 transmitted through spectral (color) filter 52, said filter being selected from the group of dye or other spectral transmission filters, multilayer dielectric stack filters, or color interference filters, and, said filter further being selected from the group of configurations of mosaic array, stripe, color-filter mask, or any combinations or permutations thereof. The color-filtered image light then enters spacer layer 53 whose refractive index is chosen to be closely matched to color-filter 52 to minimize the interfacial reflection loss. The high curvature, high numerical aperture microlens 54 captures the incident fan of rays and images; the light onto a focal area inscribed within the active region of photodiode 58 with high collection efficiency and transmittance through planarization layer 55, passivation layer 56, and between the metal photoshields 57 defining the boundary of photodiode 58.

The present invention readily accommodates variants for the optical design of the structures illustrated in the preferred embodiment, including the options of making spacer layer 53 an antireflection coating for microlens 54, making microlens 54 a multi-lens arrangement of at least two coplanar elements, cascading at least two layer-pairs of the microlens and spacer to create vertical compound lens configurations, wherein such configurations have the degree of freedom of employing lens types selected from the group consisting of convex, concave, conic sections or their derivatives, aspherics, Fresnel zone plates, holographic, or combinations and permutations thereof.

While the invention has been particularly shown and described with reference to the preferred embodiments thereof, it will be understood by those skilled in the art that various changes in form and details may be made without departing from the spirit and scope of the invention.

What is claimed is:

1. A semiconductor device having an ordered train of optoelectronic structures for high efficiency in the synthetic reconstruction of color images in a color camera, comprising:

providing a semiconductor substrate having a first patterned matrix array of pn-junction photodiodes and charge transport device structures formed therein;

a successive layer deposited on the patterned photodiode array to planarize, encapsulate, and create a designed spacer distance for a microlens array structure;

a conductive material patterned into a photoshield structure to provide light baffling between the photosensor elements;

a successive layer of high transmissivity material deposited and patterned into a planar array of microlens elements in vertical alignment with the photodiode active areas;

a successive layer of high transmissivity material serving to encapsulate and planarize the microlens array for protection from chemical, environmental or other further microelectronic processing or treatment operations that can damage, discolor or otherwise degrade the optical and spectral properties of the microlens elements;

a successive layer in which is formed a first color filter array structure, overlayed in vertical alignment with the microlens arrays and photodiode elements;

a successive layer of high transmissivity material for the encapsulation, protection, planarization, for additional sequences of spectral color filters, optical polarization layers, or other desired structures.

2. The structure of claim 1 wherein:

the microlens may be simple or multi-lens elements, said elements having shapes geometrically similar to the photodiode active area shapes, or, projecting image irradiance patterns similar in shape to the photodiode active area for maximizing fill-factor and light collection efficiency.

3. The structure of claim 1 wherein:

the color filter is comprised of a plane-matrix array comprised of patterned stripes of the same or different colors, ordered clusters of colors or groupings, multi-planar clusters or groupings, or combinations and permutations thereof.

4. The structure of claim 1 wherein:

the planarization, spacer, or encapsulation layers are anti-reflection structures which may be patterned and/or varied and matched to each planar array of microlenses or color filter layers according to their respective indices of refraction in order to minimize light transmission loss at interfacial boundaries.

5. The structure of claim 1 wherein:

Particle contamination or residues in the inter-microlens gap region, chemical and thermal damage or degradation to, or discoloration of, or off-axis displacements and/or distortions related to topographical non-planarity of microlenses are eliminated or minimized by early formation and encapsulation by the spacer of the microlens array.

6. The structure of claim 1 wherein:

the spacer layer is comprised of a birefringent material such that high-angle off-axis incident light rays are displaced back onto the active area of the photodiode elements to maximize pixel signal contrast.

7. The structure of claim 1 wherein:

the spacer or color filter layer has the property of rotary polarization such that light passed through such layers will, upon incidence to a lower boundary-layer interface, be inhibited from retro-transmission and eliminate stray light reflections and image smear.

8. The structure of claim 1 wherein:

Very high radius of curvature microlenses can be formed by thermal reflow of photoresist without damage to color filter lenses or other optical or semiconductor structures because of the early stage of forming said microlenses.

9. The structure of claim 1 wherein:

Photopolymerization or cross-linking of the photoresist material through calculated and controlled ultraviolet irradiation by suitable intense light sources such as lasers or atomic gas discharge lamps can be applied to tune the index of refraction of the microlens array(s) without effect to color filters or other structures because of the early stage of forming said microlenses.

* * * * *